United States Patent
Hou

(10) Patent No.: US 10,873,059 B2
(45) Date of Patent: Dec. 22, 2020

(54) ARRAY SUBSTRATE WITH RESPONSIVE PARTICLES, REPARATION METHOD THEREOF, AND DISPLAY DEVICE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/338,604

(22) PCT Filed: Jun. 26, 2018

(86) PCT No.: PCT/CN2018/092883
§ 371 (c)(1),
(2) Date: Apr. 1, 2019

(87) PCT Pub. No.: WO2019/015447
PCT Pub. Date: Jan. 24, 2019

(65) Prior Publication Data
US 2020/0044199 A1    Feb. 6, 2020

(30) Foreign Application Priority Data
Jul. 20, 2017 (CN) .......................... 2017 1 0599383

(51) Int. Cl.
*H01L 29/08* (2006.01)
*H01L 51/56* (2006.01)
(Continued)

(52) U.S. Cl.
CPC ............ *H01L 51/56* (2013.01); *H01L 25/048* (2013.01); *H01L 51/0005* (2013.01); *H01L 51/0012* (2013.01)

(58) Field of Classification Search
CPC .............. H01L 25/048; H01L 51/0005; H01L 51/0012; H01L 51/56
(Continued)

(56) References Cited

U.S. PATENT DOCUMENTS 6,217,721 B1 * 4/2001 Xu .................... H01L 21/76843
204/192.17
9,231,186 B2    1/2016 Busgen et al.
(Continued)

FOREIGN PATENT DOCUMENTS

| CN | 102130305 A | 7/2011 |
|----|-------------|--------|
| CN | 102460756 A | 5/2012 |

(Continued)

OTHER PUBLICATIONS

The First Chinese Office Action dated Sep. 4, 2018; Appln. No. 201710599383.2.
(Continued)

*Primary Examiner* — Caleb E Henry

(57) ABSTRACT

Provided in an embodiment of the present disclosure are an array substrate, a method for preparing the same, and a display device. The method for preparing the array substrate includes: providing a base substrate and forming a film including an organic material and responsive particles on the base substrate; and applying at least one of an electric field and a magnetic field to the film. The responsive particles drive the organic material to flow under the at least one of the electric field and the magnetic field, thereby planarizing the film to form an organic layer. By adding particles in the organic material that respond to at least one of an electric field and a magnetic field, responsive particles move under the action of the applied electric field and/or magnetic field, and the organic material is driven to be moved along with the movement of the responsive particles.

17 Claims, 3 Drawing Sheets

---

| Forming on a substrate a film comprising an organic material and electric and/or magnetic field responsive particles | — S10 |

↓

| Applying at least one of an electric field and a magnetic field to the film, in which the responsive particles drive the organic material to flow under the at least one of the electric field and the magnetic field, thereby planarizing the film to form an organic layer | — S20 |

(51) Int. Cl.
 H01L 25/04 (2014.01)
 H01L 51/00 (2006.01)
(58) Field of Classification Search
 USPC .......................................................... 257/40
 See application file for complete search history.

(56) References Cited

U.S. PATENT DOCUMENTS

| | | | |
|---|---|---|---|
| 9,570,717 | B2 | 2/2017 | Sakuma et al. |
| 9,847,382 | B2 | 12/2017 | Dai et al. |
| 2002/0191142 | A1* | 12/2002 | Oguchi ............... G02F 1/13725 |
| | | | 349/165 |
| 2003/0020073 | A1* | 1/2003 | Long ................... H01L 27/3211 |
| | | | 257/79 |
| 2004/0061927 | A1* | 4/2004 | Kanbe ..................... G02F 1/167 |
| | | | 359/296 |
| 2004/0119680 | A1* | 6/2004 | Daniel .................... G09G 3/344 |
| | | | 345/107 |
| 2005/0024710 | A1* | 2/2005 | Kanbe ..................... G02F 1/167 |
| | | | 359/296 |
| 2005/0087000 | A1* | 4/2005 | Coehoorn ............... B82Y 25/00 |
| | | | 73/53.01 |
| 2006/0082710 | A1* | 4/2006 | Kitson ................ G02F 1/13439 |
| | | | 349/139 |
| 2006/0279525 | A1* | 12/2006 | Matsuda ................. G02F 1/167 |
| | | | 345/107 |
| 2007/0026646 | A1 | 2/2007 | Chae |
| 2007/0091638 | A1* | 4/2007 | Ijzerman ........... G02F 1/133615 |
| | | | 362/611 |
| 2007/0195402 | A1* | 8/2007 | Miyazawa .............. G02F 1/167 |
| | | | 359/296 |
| 2008/0303779 | A1* | 12/2008 | Machida .............. G09G 3/3446 |
| | | | 345/107 |
| 2008/0311429 | A1* | 12/2008 | Katsuragawa .... G11B 11/10545 |
| | | | 428/820.1 |
| 2012/0044228 | A1* | 2/2012 | Hiji ....................... B32B 27/308 |
| | | | 345/211 |
| 2013/0309488 | A1 | 11/2013 | Fukami et al. |
| 2015/0277205 | A1* | 10/2015 | Kawahara ............... G02F 1/167 |
| | | | 359/296 |
| 2016/0260922 | A1 | 9/2016 | Choi |
| 2017/0160569 | A1 | 6/2017 | Liu |
| 2017/0305184 | A1* | 10/2017 | Muller .................. H01F 7/0247 |
| 2020/0075694 | A1* | 3/2020 | Dai .................... H01L 51/0005 |

FOREIGN PATENT DOCUMENTS

| | | |
|---|---|---|
| CN | 103421339 A | 12/2013 |
| CN | 103441138 A | 12/2013 |
| CN | 105118836 A | 12/2015 |
| CN | 105292756 A | 2/2016 |
| CN | 105679806 A | 6/2016 |
| CN | 106784360 A | 5/2017 |
| CN | 107394062 A | 11/2017 |

OTHER PUBLICATIONS

The International Search Report and Written Opinion dated Sep. 27, 2018; PCT/CN2018/092883.

* cited by examiner

ARRAY SUBSTRATE WITH RESPONSIVE PARTICLES, REPARATION METHOD THEREOF, AND DISPLAY DEVICE

The present application claims the priority of the Chinese Patent Application No. 201710599383.2 filed on Jul. 20, 2017, which is incorporated herein by reference as a part of the present application.

TECHNICAL FIELD

Embodiments of the present disclosure relate to an array substrate and its manufacturing method and a display device.

BACKGROUND

In display technology, an electroluminescent diode for example an organic light-emitting diode (abbreviated as OLED) has many advantages over a liquid crystal display (LCD), such as self-luminescence, fast response, wide viewing angle, high brightness, bright color, and being light and thin.

For example, an OLED display device can be classified as a top light-emitting OLED display device and a bottom light-emitting OLED display device according to different coupling modes. In the process of manufacturing the top light-emitting OLED display device, the functional layers of the OLED display device need to be manufactured on a thin film transistor (abbreviated as TFT). Most of the functional layers are made of organic materials. However, flatness and thickness uniformity of the functional layers need to be improved.

SUMMARY

At least one embodiment of the present disclosure provides a method of manufacturing an array substrate, and the method comprises: providing a base substrate; forming a film comprising an organic material and responsive particles on the base substrate; and applying at least one of an electric field and a magnetic field to the film, in which the responsive particles drive the organic material to flow under the at least one of the electric field and the magnetic field, thereby planarizing the film to form an organic layer.

For example, in the manufacturing method provided by at least one embodiment of the present disclosure, the responsive particles are configured to be movable under the at least one of the electric field and the magnetic field.

For example, in the manufacturing method provided by at least one embodiment of the present disclosure, before forming the film comprising the organic material and the responsive particles, the manufacturing method further comprises mixing the organic material and the responsive particles.

For example, in the manufacturing method provided by at least one embodiment of the present disclosure, forming the film comprising the organic material and the responsive particles comprises: forming an organic film by using the organic material, and adding the responsive particles to the organic film.

For example, in the manufacturing method provided by at least one embodiment of the present disclosure, adding the responsive particles to the organic film comprises doping the responsive particles in the organic film by inkjet printing.

For example, the manufacturing method provided by at least one embodiment of the present disclosure, further comprises: forming a thin film transistor on the base substrate, and a surface of the thin film transistor close to the film has a concave region.

For example, in the manufacturing method provided by at least one embodiment of the present disclosure, the responsive particles are doped in the organic material to form a doping region, and an orthographic projection of the doping region on the base substrate covers an orthographic projection of the concave region on the base substrate.

For example, in the manufacturing method provided by at least one embodiment of the present disclosure, a number of the responsive particles doped in the doping region is proportional to a depth of the concave region.

For example, in the manufacturing method provided by at least one embodiment of the present disclosure, the applying at least one of the electric field and the magnetic field to the film comprises: applying the at least one of the electric field and the magnetic field to an outer side of the concave region of the thin film transistor.

For example, in the manufacturing method provided by at least one embodiment of the present disclosure, an intensity of the at least one of the electric field and the magnetic field applied to the film is proportional to a depth of the concave region.

For example, in the manufacturing method provided by at least one embodiment of the present disclosure, the applying at least one of the electric field and the magnetic field to the film comprises: applying the at least one of the electric field and the magnetic field to an outer side of the thin film transistor.

For example, in the manufacturing method provided by at least one embodiment of the present disclosure, an intensity of the at least one of the electric field and the magnetic field applied to the film is proportional to a depth of the concave region.

For example, in the manufacturing method provided by at least one embodiment of the present disclosure, the electric field is a directional electric field, and the magnetic field is a directional magnetic field, and a direction of the directional electric field and the directional magnetic field is from the thin film transistor to the organic layer, or from the organic layer to the thin film transistor.

For example, in the manufacturing method provided by at least one embodiment of the present disclosure, an intensity of the directional electric field is from about 200 V/cm to 1000 V/cm, and an intensity of the directional magnetic field is from about 200 gauss to 1000 gauss.

For example, in the manufacturing method provided by at least one embodiment of the present disclosure, the responsive particles comprise electric field responsive particles and magnetic field responsive particles, and the electric field responsive particles comprise titanium dioxide particles, and the magnetic field responsive particles comprise at least one of $Fe_3O_4$ particles and $Fe_2O_3$ particles.

For example, in the manufacturing method provided by at least one embodiment of the present disclosure, the organic material comprises at least one of poly(methyl methacrylate), polyimide and silicones.

At least one embodiment of the present disclosure further provides an array substrate, and the array substrate comprises: a base substrate; and a film layer on the base substrate, in which the film layer comprises an organic material and responsive particles, and the responsive particles drive the organic material to flow under at least one of an electric field and a magnetic field.

For example, in the array substrate provided by at least one embodiment of the present disclosure, the responsive particles are configured to be movable under the at least one of the electric field and the magnetic field.

At least one embodiment of the present disclosure further provides a display device, and the display device comprises any one of the array substrates described above.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1:
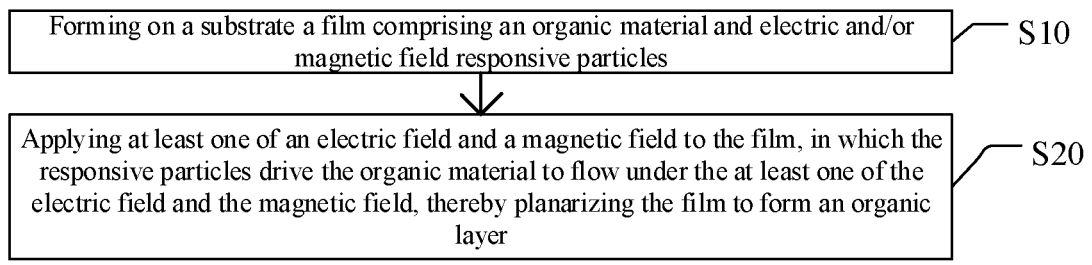
FIG. 1 is a flowchart of a manufacturing method of a film layer provided by an embodiment of the present disclosure.

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but to distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Film-forming methods of functional layers in an electroluminescent display device for example an organic light-emitting diode (OLED) display device mainly comprise an evaporation method and a solution method. The evaporation method is suitable for small organic molecules, and is characterized in that no solvent is needed in the process of forming an organic film, but the production equipment is expensive and the production cost is high, furthermore the method is neither suitable for the production of large electronic products, nor for large-scale production. The solution method is suitable for polymer materials and soluble small molecules, and the solution method mainly comprises inkjet printing, spin coating, nozzle coating, screen printing and other technologies, and the solution method is characterized in that the equipment cost is low and it has outstanding advantages in production of large products and large-scale production. Therefore, functional layers of an OLED display device are usually manufactured by inkjet printing among the solution methods. On the one hand, the structure of layers formed on the base substrate has a great influence on the distribution of the organic film formed by inkjet printing. On the other hand, the droplets made of an organic material in the solution method have the characteristics of free flow, which also affects flatness and thickness uniformity of the organic film formed finally. If flatness of an organic film is poor, it would further affect the thickness uniformity of any film formed subsequently, which results in a problem of non-uniform luminescence of pixels in the OLED display device.

The inventor of the present disclosure notes that, particles that respond to at least one of an electric field and a magnetic field can be added to an organic material to allow responsive particles to move under at least one of an external electric field and an external magnetic field, thereby driving the organic material to move along with the movement of the responsive particles and planarizing the organic layer and making other films formed on the organic layer to have more uniform thickness. At the same time, the uniformity of pixel luminescence in the OLED device is improved.

For example, at least one embodiment of the present disclosure provides a manufacturing method of an organic layer. The manufacturing method comprises: forming a film comprising an organic material and responsive particles on a base substrate; and applying at least one of an electric field and a magnetic field to the film, wherein the responsive particles drive the organic material to flow under the at least one of the electric field and the magnetic field, thereby planarizing the film to form an organic layer.

For example, FIG. 1 is a flowchart of a manufacturing method of a film layer provided by an embodiment of the present disclosure. As illustrated in FIG. 1, a manufacturing method of the organic layer comprises the following steps of S10 and S20.

Step S10: forming a film comprising an organic material and responsive particles on a base substrate.

For example, the organic material is at least one of poly (methyl methacrylate), polyimide and silicones. It should be noted that, the organic material can also be any other ingredient that meets the requirement, which is not limited herein.

For example, the responsive particles may comprise electric field responsive particles and magnetic field responsive particles. That is, the responsive particles can respond to the electric field, or the responsive particles can respond to the magnetic field. The particle size of the responsive particles is in nano-scale, and the responsive particles can be spherical, ellipsoid or other regular or irregular in shapes.

It should be noted that, the responsive particles are configured to be movable under at least one of the electric field and the magnetic field. For example, electric field responsive particles mean that the particles can move under the electric field. Similarly, magnetic field responsive particles mean that the particles can move under the magnetic field.

For example, the electric field responsive particles comprise titanium dioxide particles; the magnetic field responsive particles comprise $Fe_3O_4$ particles or $Fe_2O_3$ particles. It should be noted that, the electric field responsive particles and the magnetic field responsive particles can also be other particles capable of responding to at least one of the external electric field and the external magnetic field, and the electric field responsive particles and the magnetic field responsive particles are not limited in the embodiments of the present disclosure.

For example, the base substrate may be a glass substrate, a quartz substrate or a plastic substrate.

For example, in an example of the present disclosure, before forming the film comprising the organic material and the responsive particles, the manufacturing method further comprises mixing the organic material and the responsive particles to obtain a mixture, and applying the mixture on the base substrate. For example, the base substrate is coated with the mixture obtained by mixing the organic material and the responsive particles.

For example, in another example of the present disclosure, forming the film comprising the organic material and the responsive particles comprises: forming an organic film from the organic material firstly, and then adding the response particles to the organic film.

For example, adding the responsive particles to the organic film comprises doping responsive particles in the organic film by inkjet printing.

Step S20: applying at least one of an electric field and a magnetic field to the film, wherein the responsive particles drive the organic material to flow under the at least one of the electric field and the magnetic field, thereby planarizing the film to form a film layer.

For example, at least one of an external electric field and an external magnetic field is applied to the film in the process of pre-baking and baking the film.

At least one embodiment of the present disclosure further provides a method for manufacturing an array substrate, and the manufacturing method comprises: providing a base substrate; forming a film comprising an organic material and responsive particles on the base substrate; applying at least one of an electric field and a magnetic field to the film, wherein the responsive particles drive the organic material to flow under the at least one of the electric field and the magnetic field, thereby planarizing the film to form an organic layer. The following is illustrated by taking an array substrate of an organic light-emitting diode (OLED) as the array substrate for example.

Figure 2:
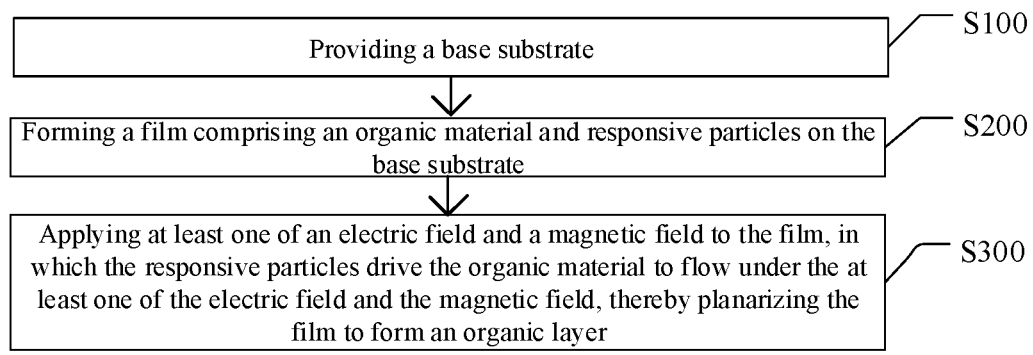
FIG. 2 is a flowchart of a manufacturing method of an OLED array substrate provided by an embodiment of the present disclosure.

For example, FIG. 2 is a flowchart of a manufacturing method of an OLED array substrate provided by an embodiment of the present disclosure. As illustrated in FIG. 2, the manufacturing method of the OLED array substrate comprises the following steps S100 to S300:

Step S100: providing a base substrate;

For example, the base substrate is a glass substrate, a quartz substrate or a plastic substrate.

Step S200: forming a film comprising an organic material and responsive particles on the base substrate;

For example, the organic material is at least one of poly (methyl methacrylate), polyimide and silicones. It should be noted that, the organic material can also be any other ingredient that meets the requirements, which is not limited herein.

For example, the responsive particles are configured to be movable under at least one of the electric field and the magnetic field.

For example, the responsive particles comprise electric field responsive particles and magnetic field responsive particles. That is, the responsive particles can respond to the electric field, or the responsive particles can respond to the magnetic field. The particle size of the responsive particles is in nano-scale, and the responsive particles can be spherical, ellipsoid or other regular or irregular in shapes.

It should be noted that, the responsive particles are configured to be movable under at least one of the electric field and the magnetic field. For example, electric field responsive particles mean that the particles can move under an electric field. Similarly, magnetic field responsive particles mean that the particles can move under a magnetic field.

For example, the electric field responsive particles comprise titanium dioxide particles; the magnetic field responsive particles comprise $Fe_3O_4$ particles or $Fe_2O_3$ particles. It should be noted that, the electric field responsive particles and the magnetic field responsive particles can also be other particles capable of responding to at least one of external electric field and external magnetic field, which are not limited in the embodiments of the present disclosure.

For example, in an example of the present disclosure, before forming the film comprising the organic material and the responsive particles, the manufacturing method further comprises mixing the organic material and the responsive particles to obtain a mixture, and applying the mixture on the base substrate. For example, the base substrate is coated with the mixture obtained by mixing the organic material and the responsive particles.

For example, before applying the mixture of the organic material and the responsive particles on the base substrate, a thin film transistor is further formed on the base substrate.

Step S300: applying at least one of an electric field and a magnetic field to the film, wherein the responsive particles drive the organic material to flow under the at least one of the electric field and the magnetic field, thereby planarizing the film to form an organic layer.

For example, at least one of the electric field and the magnetic field is applied to the film in the process of pre-baking and baking the film.

For example, the thin film transistor formed on the base substrate has a top-gate structure, that is, the thin film transistor comprises: an active layer, a gate insulating layer arranged on the active layer and covering the whole base substrate, a gate electrode arranged on the gate insulating layer, an interlayer insulating layer arranged on the gate electrode and covering the whole base substrate, and a first source/drain electrode and a second source/drain electrode arranged on the interlayer insulating layer.

It should be noted that, because the thin film transistor arranged on the base substrate generally comprises a plurality of film layers such as the gate electrode, the first source/drain electrode, the second source/drain electrode and the gate insulating layer, and each of the film layers has a specific pattern, a plurality of convex structures would be generated upon superimposing a plurality of layers together. The pattern of the convex structures is determined by the pattern of each of the film layers constituting the thin film transistor, and existence of the convex structures would result in concave structures. Therefore, the thin film transistor (TFT) comprises a plurality of concave regions located between the convex structures and located at the edge. A depth of each of the concave regions ranges from 10 nanometers to 1 micron, and the depths of concave regions are the same or different. Therefore, the concave regions of the thin film transistor formed by different fabrication processes may be different. For example, the concave regions are determined by the pattern of each of the film layers in the thin film transistor. Due to the concave regions in the thin film transistor, the untreated films formed on the thin film transistor must also have concave regions, which leads to the technical problem of uneven film layers on the thin film transistor.

For example, the number of the concave regions in the thin film transistor is multiple, and the number of the concave regions is determined by the actual manufacturing process, which is not limited in the embodiments of the present disclosure.

For example, the film comprising the organic material and the responsive particles has a thickness of about 1 micron to 3 microns, such as about 1 micron, 2 microns or 3 microns. The thickness of the film is not limited in the embodiments of the present disclosure, and its thickness can be determined according to actual requirements.

For example, in an embodiment of the present disclosure, the applying at least one of the electric field and the magnetic field to the film comprises: applying the at least one of the electric field and the magnetic field to the outer sides of the concave regions of the thin film transistor, and an intensity of the at least one of the electric field and the magnetic field applied to the film is proportional to a depth of the concave regions. The deeper the depth of the concave regions is, the stronger the intensity of the at least one of the electric field and the magnetic field to be applied is required.

It should be noted that, the outer sides of the concave regions refer to all the outer surfaces of the concave regions, that is, at least one of the external electric field and the external magnetic field is directly applied to the concave regions.

For example, in an embodiment of the present disclosure, the applying at least one of the electric field and the magnetic field to the film comprises: applying the at least one of the electric field and the magnetic field to the outer sides of the thin film transistor, and the intensity of the at least one of the electric field and the magnetic field applied is proportional to the depth of the concave regions.

It should be noted that, the outer sides of the thin film transistor refer to all the outer surfaces of the thin film transistor.

In an embodiment of the present disclosure, applying the at least one of the electric field and the magnetic field to the outer sides of the concave regions of the thin film transistor is to ensure that the responsive particles uniformly dispersed in the organic material aggregate in the position corresponding to the concave regions of the film. It should be noted that, the stronger the intensity of the at least one of the electric field and the magnetic field applied, the more responsive particles move to the position corresponding to the concave regions, the stronger the motion of the responsive particles toward the position corresponding to the concave regions of the film, which further drives the organic material to move and thus avoid the technical problem of uneven films caused by the deeper concave regions and the smaller number of responsive particles. In this way, the film is further planarized at the unevenness positions.

For example, in a case that the organic layer is a planarizition layer, the electric and/or magnetic field is directional, and a direction of the directional electric and/or magnetic field is from the thin film transistor to the planarizition layer, or from the planarizition layer to the thin film transistor.

For example, in a case that the direction of the directional electric field and the direction of the directional magnetic field are from the thin film transistor to the planarizition layer, after applying the at least one of the directional electric field and the directional magnetic field, the responsive particles move directionally toward a side of the film far away from the thin film transistor to aggregate. In a case that the direction of the directional electric field and the direction of the directional magnetic field are from the planarizition layer to the thin film transistor, after applying the at least one of the directional electric field and the directional magnetic field, the responsive particles move directionally toward a side of the film close to the thin film transistor to aggregate, which drives the organic material to move toward a side away from the thin film transistor.

For example, an intensity of the directional electric field is from about 200 V/cm to 1000 V/cm, and an intensity of the directional magnetic field is from about 200 gauss to 1000 gauss.

For example, the intensity of the directional electric field is 200 V/cm, 400 V/cm, 600 V/cm, 800 V/cm or 1000 V/cm, and the intensity of the directional magnetic field is 200 gauss, 400 gauss, 600 gauss, 800 gauss or 1000 gauss. The embodiments of the present disclosure do not limit the intensity of the directional electric field and the directional magnetic field.

In the manufacturing method of the OLED array substrate provided by an embodiment of the present disclosure, particles that respond to at least one of the electric field and the magnetic field are added to the organic material, in this way, the responsive particles move under at least one of the external electric field and the external magnetic field, thereby driving the organic material to move along with the movement of the responsive particles and planarizing the organic layer. At the same time, the uniformity of pixel luminescence in the OLED device is improved.

The manufacturing method of the OLED array substrate provided by an embodiment of the present disclosure is further described in connection with FIG. 3(*a*) to FIG. 3(*c*).

Figure 3:
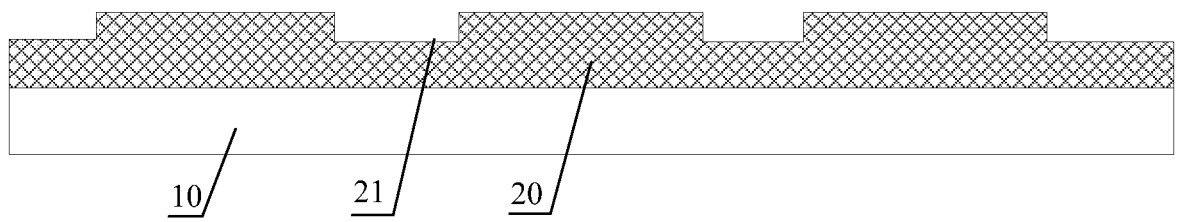
FIG. 3(a) is a first schematic diagram of a manufacturing method of an OLED array substrate provided by an embodiment of the present disclosure.
FIG. 3(b) is a second schematic diagram of a manufacturing method of an OLED array substrate provided by an embodiment of the present disclosure.
FIG. 3(c) is a third schematic diagram of a manufacturing method of an OLED array substrate provided by an embodiment of the present disclosure.
Figure 3:
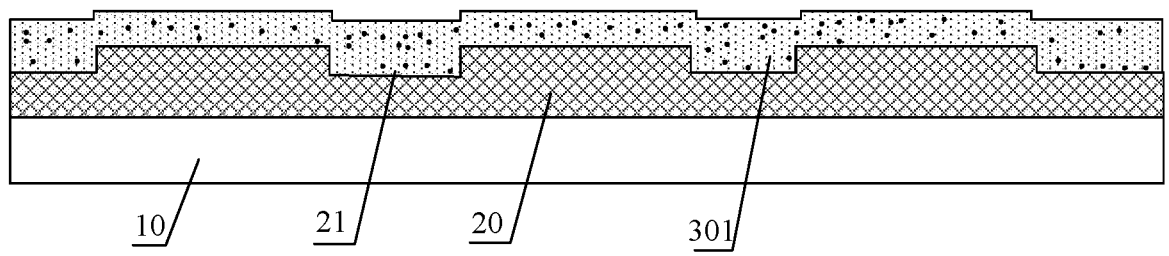
Figure 3:
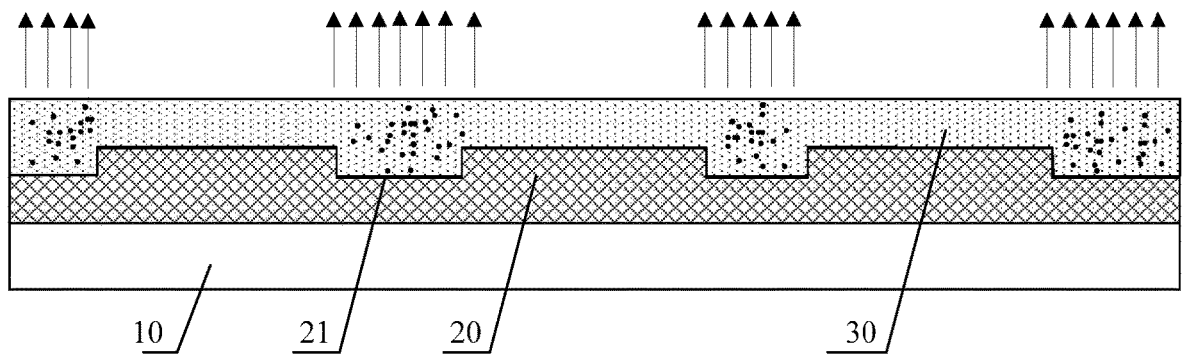

Step S310 comprises forming a thin film transistor 20 having a plurality of concave regions 21 on a base substrate 10, and the structure schematic diagram is illustrated in FIG. 3 (*a*).

For example, in an embodiment of the present disclosure, the base substrate 10 is pre-cleaned before forming the thin film transistor 20 on the base substrate 10.

For example, the number of the concave regions 21 is at least 2, for example, 3, 4, 6 and so on. FIG. 3 (*a*) is illustrated by taking three concave regions for example, and the number of the concave regions is not limited in the embodiments of the present disclosure.

For example, in an embodiment of the present disclosure, the step S310 may further comprise: depositing a buffer layer on the base substrate. The buffer layer plays the role of preventing the active layer from being polluted. An amorphous silicon film is deposited on the buffer layer by a plasma enhanced chemical vapor deposition (PECVD) process, and then the buffer layer is dehydrogenated. Afterwards, the amorphous silicon film is crystallized by excimer laser to form polycrystalline silicon, then the polycrystalline silicon is exposed and etched to form the active layer. Then, the gate insulating layer is deposited on the active layer by the PECVD process, and the gate electrode is formed on the gate insulating layer. On the basis of the above structure, the plasma injection process is carried out. A source and drain P-type doping (the source and drain P-type doping belongs to a semiconductor doping process, and the purpose of the plasma injection process is to make the semiconductor material conductive) of the active layer is formed by using the gate electrode as a mask. The PECVD process is used for depositing an interlayer insulation layer on the gate electrode, and the interlayer insulation layer covers the whole base substrate, and on the basis of this structure, the interlayer insulation layer is exposed and etched to form a via hole structure. A source and drain metal layer is deposited on the interlayer insulation layer by a magnetron sputtering method, and the exposure and etching processes are carried out to form a first source and drain electrode and a second source and drain electrode.

Step S320 comprises mixing the organic material and the responsive particles; and coating the thin film transistor with a film 301 comprising the organic material and the responsive particles. The film 301 covers the whole base substrate 10, and the structure formed is illustrated in FIG. (3b).

For example, the organic material, the electric field responsive particles and the magnetic field responsive particles can refer to the related contents mentioned above, which are omitted herein.

It should be noted that, a thickness of the film formed on the thin film transistor is 1 micron to 3 microns. The film is formed by a method such as a spinning coating, a brushing coating and a spraying coating.

Step S330 comprises applying at least one of the electric field and the magnetic field to the film. The responsive particles drive the organic material to flow under the at least one of the electric field and the magnetic field, thereby planarizing the film to form an organic layer 30. For example, the organic layer 30 is a planarization layer, and the structure formed is illustrated in FIG. 3 (c).

For example, the following is illustrated by taking the organic layer 30 as the planarization layer for example. In an embodiment of the present disclosure, at least one of the electric field and the magnetic field is applied to the outer side of the concave regions of the thin film transistor, and the direction of the electric field and/or the magnetic field is from the thin film transistor to the planarization layer, or from the planarization layer to the thin film transistor. FIG. 3 (c) is illustrated by taking the direction from the thin film transistor to the planarization layer.

For example, the responsive particles are doped in the planarization layer to form doping regions, and the orthographic projection of the doping regions on the base substrate covers the orthographic projection of the concave regions of the thin film transistor on the base substrate.

It should be noted that, the orthographic projection of the doping regions in the planarization layer on the base substrate covers the orthographic projection of the concave regions of the thin film transistor on the base substrate, and the "cover" herein means that the area of the orthographic projection of the doping regions in the planarization layer on the base substrate are equal to that of the orthographic projection of the concave regions of the thin film transistor on the base substrate. That is, the orthographic projection of the doping regions in the planarization layer on the base substrate completely overlaps with the orthographic projection of the concave regions of the thin film transistor on the base substrate, or the orthographic projection of the doping regions in the planarization layer on the base substrate is larger than the orthographic projection of the concave regions of the thin film transistor on the base substrate.

For example, an embodiment of the present disclosure further provides another method of manufacturing the OLED array substrate, which differs from the above-mentioned method of manufacturing the OLED array substrate in that:

Step S200 comprises: coating the thin film transistor with a film comprising an organic material; and adding the responsive particles to the organic material.

For example, adding the responsive particles to the organic film comprises: doping the responsive particles in the organic film by inkjet printing.

For example, the thin film transistor formed on the base substrate is a top-gate structure, that is, the thin film transistor comprises: an active layer, a gate insulating layer arranged on the active layer and covering the whole base substrate, a gate electrode arranged on the gate insulating layer, an interlayer insulating layer arranged on the gate electrode and covering the whole base substrate, and a first source/drain electrode and a second source/drain electrode arranged on the interlayer insulating layer and electrically connected to the active layer.

It should be noted that, the thin film transistor may be a bottom-gate structure. The gate electrode is arranged on the base substrate. The active layer is formed on a side of the gate electrode far away from the base substrate. The other elements of the thin film transistor having a bottom-gate structure can refer to the related descriptions of the thin film transistor having a top-gate structure mentioned above, which are omitted herein.

It should be noted that, because the thin film transistor arranged on the base substrate generally comprises a plurality of film layers such as the gate electrode, the first source/drain electrode, the second source/drain electrode and the gate insulating layer, and each of the film layers has a specific pattern, a plurality of convex structures would be generated upon superimposing a plurality of layers together. The pattern of the convex structures is determined by the pattern of each of the film layers constituting the thin film transistor, and existence of the convex structures would result in concave structures. Therefore, the thin film transistor (TFT) comprises a plurality of concave regions located between the convex structures and located at the edge. A depth of each of the concave regions ranges from 10 nanometers to 1 micron, and the depths of concave regions are the same or different. Therefore, the concave regions of the thin film transistor formed by different fabrication processes may be different. For example, the concave regions are determined by the pattern of each of the film layers in the thin film transistor. Due to the concave regions in the thin film transistor, the untreated films formed on the thin film transistor must also have concave regions, which leads to the technical problems of unevenness and thickness nonuniformity of film layers on the thin film transistor.

For example, in an embodiment of the present disclosure, a surface of a side of the thin film transistor close to the film has a plurality of concave regions; the orthographic projection of the doping regions formed by responsive particles in the organic material on the base substrate covers the orthographic projection of the concave regions of the thin film transistor on the base substrate.

It should be noted that, the orthographic projection of the doping regions formed by responsive particles in the organic material on the base substrate covers the orthographic projection of the concave regions of the thin film transistor on the base substrate, and the "cover" herein means that the area of the orthographic projection of the doping regions formed by responsive particles in the organic material on the base substrate are equal to that of the orthographic projection of the concave regions of the thin film transistor on the base substrate. That is, the orthographic projection of the doping regions formed by responsive particles in the organic material on the base substrate completely overlaps with the orthographic projection of the concave regions of the thin film transistor on the base substrate, or the orthographic projection of the doping regions formed by responsive particles in the organic material on the base substrate is larger than the orthographic projection of the concave regions of the thin film transistor on the base substrate.

For example, the number of the responsive particles doped in the doping regions is proportional to the depth of the concave regions, that is, the deeper the depth of the concave regions is, the more the number of the responsive particles doped in the doping regions of the organic material. On the contrary, the shallower the depth of the concave regions is, the less the number of the responsive particles doped in the doping regions of the organic material.

For example, the film comprising the organic material and the responsive particles has a thickness of 1 micron to 3 microns. The thickness of the film is not limited in the embodiments of the present disclosure, and its thickness can be determined according to actual requirements.

For example, in at least one embodiment of the present disclosure, applying at least one of the electric field and the magnetic field to the film in the step S300 comprises: applying the at least one of the electric field and the magnetic field to the outer side of the thin film transistor, or applying the at least one of the electric field and the magnetic field to the outer side of the concave region of the thin film transistor, wherein the intensity of the at least one of the electric field and the magnetic field applied to the film is proportional to a depth of the concave regions.

For example, since the responsive particles in an embodiment of the present disclosure are doped at least at positions corresponding to the concave regions of the film, the at least one of the electric field and the magnetic field may be located outside the whole thin film transistor or located outside the concave regions of the thin film transistor.

It should be noted that, the stronger the intensity of the at least one of the electric field and the magnetic field applied to the film, the stronger the motion of the responsive particles toward the positions corresponding to the concave regions of the film, thereby further driving the organic material to move, and planarizing the film at the unevenness positions.

For example, the external electric field is a directional electric field, and the external magnetic field is a directional magnetic field. Taking the organic layer as a planarizition layer for example, the direction of the directional electric field and the direction of the directional magnetic field are from the thin film transistor to the planarizition layer, or from the planarizition layer to the thin film transistor.

For example, in a case that the direction of the directional electric field and the direction of the directional magnetic field are from the thin film transistor to the planarizition layer, after applying the at least one of the directional electric field and the directional magnetic field, the responsive particles move directionally toward a side of the film far away from the thin film transistor to aggregate. In a case that the direction of the directional electric field and the direction of the directional magnetic field are from the planarizition layer to the thin film transistor, after applying the at least one of the directional electric field and the directional magnetic field, the responsive particles move directionally toward a side of the film close to the thin film transistor to aggregate, which drives the organic material to move toward a side away from the thin film transistor.

The manufacturing method of the OLED array substrate provided by another embodiment of the present disclosure is further described in connection with FIG. 4 (*a*) to FIG. 4 (*c*).

Step S410 comprises forming a thin film transistor 20 having a plurality of concave regions 21 on a base substrate 10, and forming a film 302 on the thin film transistor 20. The film 302 covers the whole base substrate 10, for example, as illustrated in FIG. 4 (*a*).

The material of the base substrate 10 can refer to the contents in the above description. The base substrate 10 is required to be pre-cleaned before forming the thin film transistor 20 on the base substrate 10.

For example, the number of the concave regions 21 is at least 2. FIG. 4 (*a*) is illustrated by taking three concave regions for example, and the number of the concave regions 21 is not limited in the embodiments of the present disclosure.

In an embodiment of the present disclosure, the detail of forming the thin film transistor in step S410 can refer to the description above for step S310, which is omitted herein.

For example, the thickness of the film is 1 micron to 3 microns. The film is formed by a method, such as a spinning coating, a brushing coating and a spraying coating.

Figure 4:
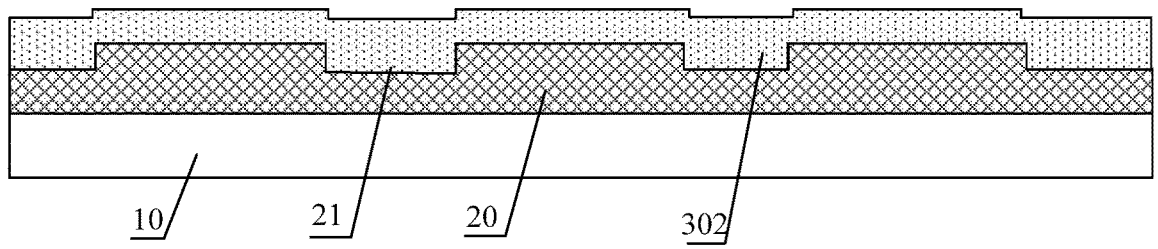
FIG. 4(a) is a first schematic diagram of another manufacturing method of another OLED array substrate provided by an embodiment of the present disclosure.
FIG. 4(b) is a second schematic diagram of another manufacturing method of another OLED array substrate provided by an embodiment of the present disclosure.
FIG. 4(c) is a third schematic diagram of another method manufacturing method of another OLED array substrate provided by an embodiment of the present disclosure.
Figure 4:
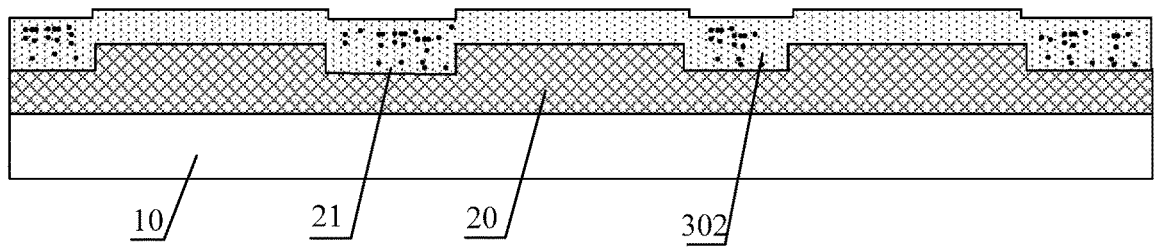
Figure 4:
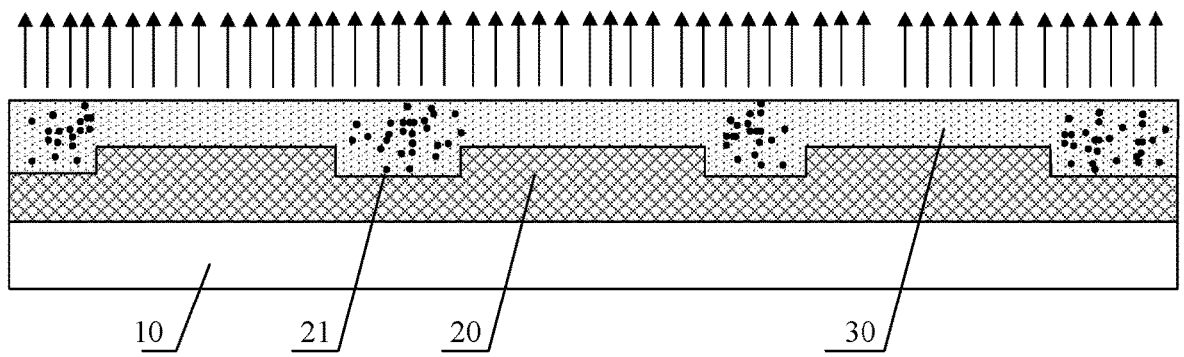

Step S420 comprises doping the responsive particles in the organic material by inkjet printing, as illustrated in FIG. 4 (*b*).

For example, in an embodiment of the present disclosure, the orthographic projection of the doping regions formed by doping the responsive particles in the organic material on the base substrate covers the orthographic projection of the concave regions of the thin film transistor on the base substrate.

Step S430 comprises applying at least one of the electric field and the magnetic field to the film. The responsive particles drive the organic material to flow under the at least one of the electric field and the magnetic field thereby forming a planarized organic layer 30, and the structure formed is illustrated in FIG. 4 (*c*).

In an embodiment of the present disclosure, the at least one of the electric field and the magnetic field is applied to the outer sides of the thin film transistor, or the at least one of the electric field and the magnetic field is applied to the outer sides of the concave regions of the thin film transistor. FIG. 4 (*c*) is illustrated by applying the at least one of the electric field and the magnetic field to the outer sides of the whole thin film transistor.

For example, the organic layer 30 is a planarization layer, a pixel definition layer, or a passivation layer, and so on.

For example, the following is illustrated by taking the organic layer 30 as the planarization layer for example. The external electric field and the external magnetic field are directional electric field and directional magnetic field respectively. The direction of the directional electric field and the direction of the directional magnetic field are from the thin film transistor to the planarization layer, or from the planarization layer to the thin film transistor. FIG. 4 (c) is illustrated by taking the direction from the thin film transistor to the planarization layer for example.

Figure 5:
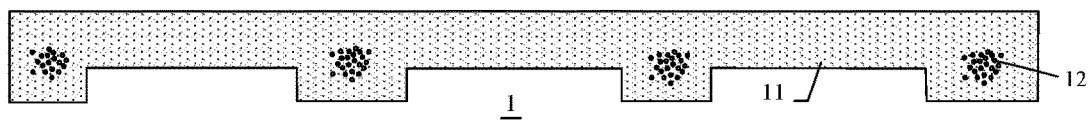
FIG. 5 is a schematic diagram of a structure of a film layer provided by an embodiment of the present disclosure.

At least one embodiment of the present disclosure further provides an array substrate, and the array substrate comprises a base substrate and a film layer on the base substrate. For example, FIG. 5 is a schematic diagram of a structure of a film layer provided by an embodiment of the present disclosure. As illustrated in FIG. 5, the film layer 1 comprises an organic material 11 and responsive particles 12, wherein the responsive particles 12 drive the organic material 11 to flow under at least one of the electric field and the magnetic field to form the film layer 1.

For example, in the array substrate provided by at least one embodiment of the present disclosure, the responsive particles are configured to be movable under the at least one of the electric field and the magnetic field.

Figure 6:
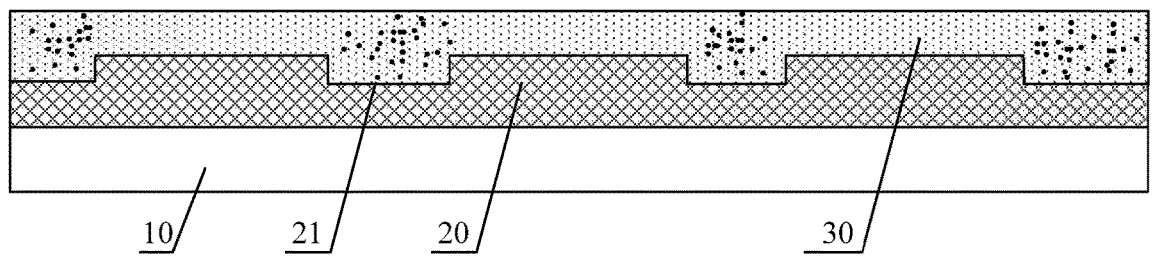
FIG. 6 is a schematic diagram of a cross-sectional structure of the OLED array substrate provided by an embodiment of the present disclosure.

For example, FIG. 6 is a schematic diagram of a structure of an OLED array substrate provided by at least one embodiment of the present disclosure. As illustrated in FIG. 6, the OLED array substrate provided by the embodiment of the present disclosure is manufactured by the manufacturing method of the OLED array substrate described above, and the array substrate comprises any of the above-mentioned film layers. Its principle and effect are similar to those described above, which are omitted herein.

For example, the OLED array substrate provided by an embodiment of the present disclosure comprises a base substrate 10, a thin film transistor 20 disposed on the surface of the base substrate 10 and having a plurality of concave regions 21, and an organic layer 30 located on a side of the thin film transistor 20 far away from the base substrate 10. For example, the organic layer is the planarizition layer.

At least one embodiment of the present disclosure further provides a display panel, and the display panel comprises any one of the array substrates described above. The principle and effect of the display panel can be referred to the related description above, which are omitted herein.

At least one embodiment of the present disclosure further provides a display device, and the display device comprises any one of the array substrates described above.

For example, the display device provided in an embodiment of the present disclosure comprises an array substrate, whose principle and effect can be referred to in the relevant description above, and will not be repeated here.

For example, the display device may be a liquid crystal display panel, an electronic paper, an OLED panel, a mobile phone, a tablet computer, a TV, a display, a notebook computer, a digital photo frame, a navigator and other products or components having a display function.

The array substrate and its manufacturing method, the film layer and the display device provided by at least one embodiment of the present disclosure have at least one beneficial effect as follows:

(1) In the manufacturing method of the film layer provided by at least one embodiment of the present disclosure, particles that respond to at least one of the electric field and the magnetic field are added to the organic material. In this way, the responsive particles move under at least one of the external electric field and the external magnetic field to drive the organic material to move along with the movement of the responsive particles, so that the film layer is planarized;

(2) In the manufacturing method of the film layer provided by at least one embodiment of the present disclosure, other film layers prepared on the organic layer are also more uniform, and at the same time, the uniformity of light emitted from pixels of the OLED device is improved.

Please note that:

(1) the drawings of the embodiments of the present disclosure are only related to the structures mentioned in the embodiments of the present disclosure, and other structures can be further obtained by general designs;

(2) for the sake of clarity, in the drawings for describing the embodiments of the present disclosure, sizes of layers or regions are not drawn according to an actual scale but are exaggerated or diminished; it will be understood that when an element such as a layer, a film, a region or a substrate is referred to as being "on" or "under" another element, the element may be "directly" disposed "on" or "under" another element, or there may be an intermediate element;

(3) the embodiments of the present disclosure and the features therein can be combined with each other to obtain new embodiments in the absence of conflicts.

What are described above is related to only the illustrative embodiments of the present disclosure and not limitative to the protection scope of the present application. The protection scope of the present application shall be defined by the accompanying claims.

What is claimed is:

1. A manufacturing method of an array substrate, comprising:
providing a base substrate;
forming a thin film transistor on the base substrate, wherein a surface of the thin film transistor close to the film has a concave region;
forming a film comprising an organic material and responsive particles and covering the surface of the thin film transistor on the base substrate; and
applying at least one of an electric field and a magnetic field to the film, wherein the responsive particles drive the organic material to flow under the at least one of the electric field and the magnetic field, thereby planarizing the concave region and the film to form an organic layer,
wherein the forming the film comprising the organic material and the responsive particles comprises: forming an organic film by using the organic material, and adding the responsive particles to the organic film, and
the adding the responsive particles to the organic film comprises doping the responsive particles in the organic film by inkjet printing.

2. The manufacturing method according to claim 1, wherein the responsive particles are configured to be movable under the at least one of the electric field and the magnetic field.

3. The manufacturing method according to claim 1, wherein the responsive particles are doped in the organic material to form a doping region, and an orthographic projection of the doping region on the base substrate covers an orthographic projection of the concave region on the base substrate.

4. The manufacturing method according to claim 3, wherein a number of the responsive particles doped in the doping region is proportional to a depth of the concave region.

5. The manufacturing method according to claim 1, wherein the applying at least one of the electric field and the magnetic field to the film comprises: applying the at least one of the electric field and the magnetic field to an outer side of the concave region of the thin film transistor.

6. The manufacturing method according to claim 5, wherein an intensity of the at least one of the electric field and the magnetic field applied is proportional to a depth of the concave region.

7. The manufacturing method according to claim 5, wherein the electric field is a directional electric field, and the magnetic field is a directional magnetic field, and a direction of the directional electric field and a direction of the directional magnetic field are from the thin film transistor to the organic layer, or from the organic layer to the thin film transistor.

8. The manufacturing method according to claim 7, wherein an intensity of the directional electric field is from about 200 V/cm to 1000 V/cm, and an intensity of the directional magnetic field is from about 200 gauss to 1000 gauss.

9. The manufacturing method according to claim 1, wherein the applying at least one of the electric field and the magnetic field to the film comprises: applying the at least one of the electric field and the magnetic field to an outer side of the thin film transistor.

10. The manufacturing method according to claim 9, wherein an intensity of the at least one of the electric field and the magnetic field applied is proportional to a depth of the concave region.

11. The manufacturing method according to claim 1, wherein the responsive particles comprise electric field responsive particles and magnetic field responsive particles, and the electric field responsive particles comprise titanium dioxide particles, and the magnetic field responsive particles comprise at least one of $Fe_3O_4$ particles and $Fe_2O_3$ particles.

12. The manufacturing method according to claim 1, wherein the organic material comprises at least one of poly (methyl methacrylate), polyimide and silicones.

13. An array substrate, comprising:
a base substrate; and
a film layer on the base substrate, wherein the film layer comprises an organic material and responsive particles, and the responsive particles drive the organic material to flow under at least one of an electric field and a magnetic field;
a surface, close to the base substrate, of the film layer includes a plurality of flat regions and a concave region between adjacent plat regions of the plurality of flat regions, the concave region is concave toward the base substrate; the film layer comprises a first portion in the concave region and a second portion in the flat regions, the first portion is integrated with the second portion, and a surface, away from the base substrate, of the film layer is flat; at least a part of the responsive particles are in the first portion.

14. The array substrate according to claim 13, wherein the responsive particles are configured to be movable under the at least one of the electric field and the magnetic field.

15. A display device, comprising: the array substrate according to claim 13.

16. The array substrate according to claim 13, further comprising a thin film transistor, wherein a surface of the thin film transistor close to the film layer has a plurality of concave regions; orthographic projections of the plurality of concave regions on the base substrate cover orthographic projections of the responsive particles on the base substrate.

17. The array substrate according to claim 13, wherein all the responsive particles are in the first portion.

* * * * *